(12) United States Patent
Oguri

(10) Patent No.: US 11,109,511 B2
(45) Date of Patent: Aug. 31, 2021

(54) COOLING DEVICE AND METHOD OF MANUFACTURING COOLING DEVICE

(71) Applicant: SANOH INDUSTRIAL CO., LTD., Tokyo (JP)

(72) Inventor: Takeo Oguri, Ibaraki (JP)

(73) Assignee: SANOH INDUSTRIAL CO., LTD., Tokyo (JP)

(*) Notice: Subject to any disclaimer, the term of this patent is extended or adjusted under 35 U.S.C. 154(b) by 0 days.

(21) Appl. No.: 16/475,145

(22) PCT Filed: Oct. 18, 2017

(86) PCT No.: PCT/JP2017/037761
§ 371 (c)(1),
(2) Date: Jul. 1, 2019

(87) PCT Pub. No.: WO2018/131243
PCT Pub. Date: Jul. 19, 2018

(65) Prior Publication Data
US 2019/0335610 A1    Oct. 31, 2019

(30) Foreign Application Priority Data
Jan. 13, 2017  (JP) .............................. JP2017-004412

(51) Int. Cl.
*H01L 23/473* (2006.01)
*H05K 7/20* (2006.01)
(Continued)

(52) U.S. Cl.
CPC .................................. *H05K 7/2029* (2013.01)

(58) Field of Classification Search
CPC .......................... H01L 23/473; H05K 7/20254; H05K 7/2029; F28F 3/048; F28F 3/08;
(Continued)

(56) References Cited

U.S. PATENT DOCUMENTS 4,147,210 A * 4/1979 Pronko ..................... F28F 1/44
165/165
5,193,611 A   3/1993 Hesselgreaves
(Continued)

FOREIGN PATENT DOCUMENTS

JP    2006-313054 A    11/2006
JP    2008-170060 A    7/2008
(Continued)

OTHER PUBLICATIONS

Search Report and Written Opinion in International Application No. PCT/JP2017/037761 dated Jan. 9, 2018, 10 pages.
(Continued)

*Primary Examiner* — Frantz F Jules
*Assistant Examiner* — Jason N Thompson
(74) *Attorney, Agent, or Firm* — Marshall, Gerstein & Borun LLP

(57) ABSTRACT

A cooling device includes: a case equipped with a supply port for a coolant and a discharge port for the coolant and a laminated core disposed in the case, the laminated core comprising a plurality of punched plates, each with the same shape, and each punched plate including: a plurality of linear portions that extend in waveform shapes in a flow direction of the coolant and that are spaced apart in an amplitude direction of the waveforms, and linking portions that are spaced apart in an extension direction of the linear portions and that link the linear portions to one another in the amplitude direction, the punched plates being alternately disposed front-to-back and the linear portions being superposed over one another, and the linking portions of the superposed punched plates being disposed spaced apart in the extension direction.

8 Claims, 11 Drawing Sheets

(51) Int. Cl.
*F28F 3/04* (2006.01)
*F28F 3/08* (2006.01)

(58) Field of Classification Search
CPC ....... F28F 3/10; F28F 3/02; F28F 3/12; F28D 2021/0029; F28D 2021/0028
USPC ........................................................ 165/80.4
See application file for complete search history.

(56) References Cited

U.S. PATENT DOCUMENTS

| | | | | |
|---|---|---|---|---|
| 5,423,376 | A * | 6/1995 | Julien | F28F 3/086 165/168 |
| 6,082,445 | A * | 7/2000 | Dugan | F28D 9/0081 165/167 |
| 2006/0108100 | A1* | 5/2006 | Goldman | F28F 3/12 165/80.4 |
| 2007/0165190 | A1* | 7/2007 | Takagi | G03B 21/145 353/54 |
| 2007/0246204 | A1* | 10/2007 | Lai | F28F 3/086 165/166 |
| 2013/0020063 | A1* | 1/2013 | Fetvedt | F28F 3/048 165/168 |
| 2013/0048261 | A1* | 2/2013 | Scott | F28F 3/086 165/185 |
| 2013/0180697 | A1* | 7/2013 | Chen | H01L 23/473 165/185 |
| 2016/0370128 | A1* | 12/2016 | Agata | F28F 3/027 |
| 2017/0037834 | A1* | 2/2017 | Chen | F28F 3/12 |

FOREIGN PATENT DOCUMENTS

| | | |
|---|---|---|
| JP | 2008-282969 A | 11/2008 |
| JP | 2010-114174 A | 5/2010 |
| JP | 2010114174 A * | 5/2010 |
| JP | 2012-013249 A | 1/2012 |
| JP | 5005314 B2 | 8/2012 |
| JP | 6026808 B2 | 11/2016 |
| JP | 2016/207897 A | 12/2016 |

OTHER PUBLICATIONS

Extended European Search Report in EP Application No. 17891934.6 dated Aug. 7, 2020, 9 pages.
Office Action in JP Application No. 2017-004412 dated Apr. 13, 2021, 8 pages.

* cited by examiner

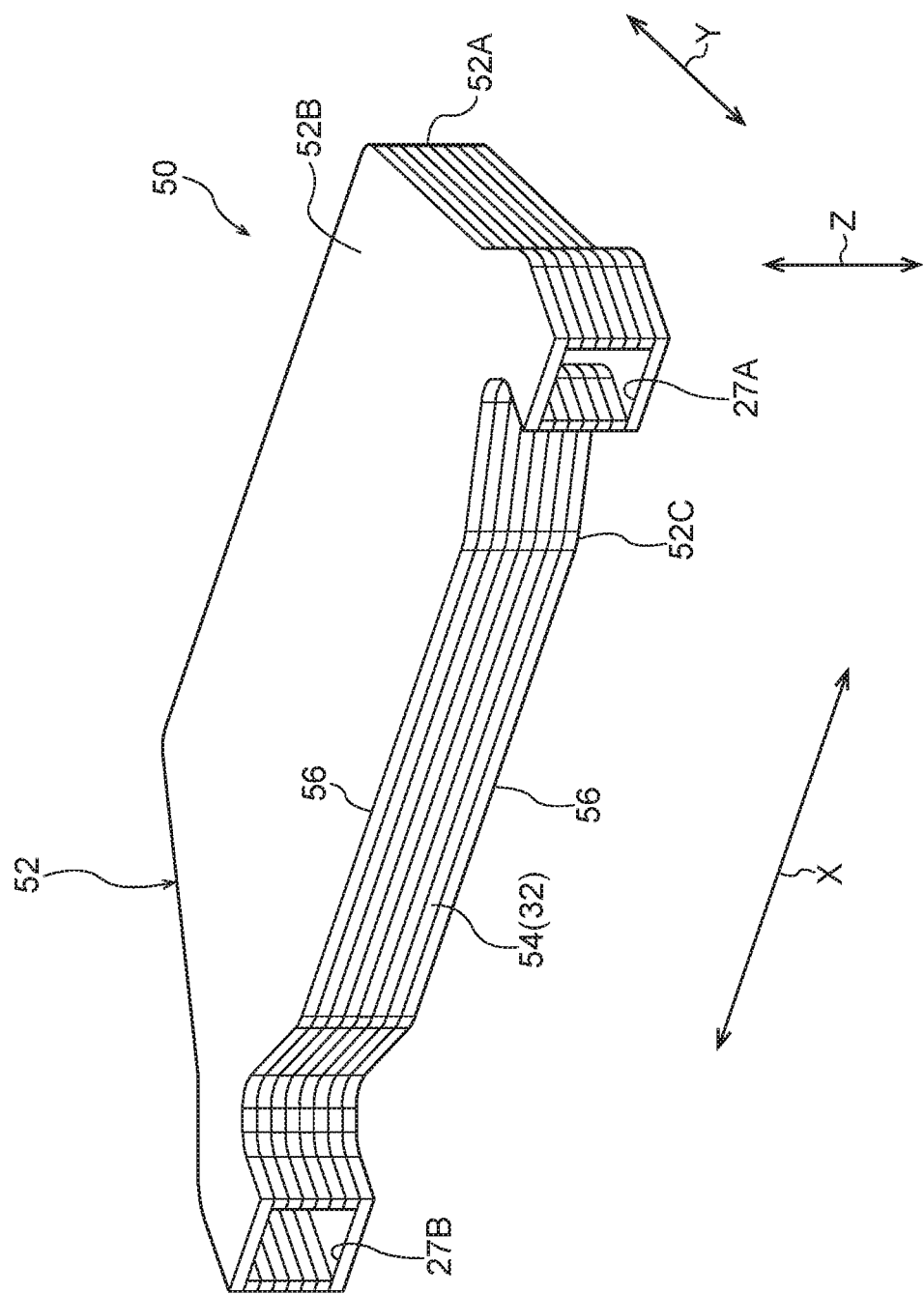

COOLING DEVICE AND METHOD OF MANUFACTURING COOLING DEVICE

TECHNICAL FIELD

The present disclosure relates to a cooling device and to a method of manufacturing the cooling device.

BACKGROUND ART

Japanese Patent No. 6,026,808 discloses a heat sink in which a stacked core is disposed in a case through which a coolant flows. Punched plates of the stacked core each include plural linear portions that extend in linear shapes in a first direction and are provided to be spaced apart in a direction crossing the first direction, and linking portions that are provided to be spaced apart in the first direction and link adjacent linear portions with one another in the crossing direction. The stacked core is formed by a plural number of the punched plates being stacked such that the linear portions are superposed with one another but the linking portions are disposed spaced apart from one another in the first direction.

SUMMARY OF INVENTION

Technical Problem

In Japanese Patent No. 6,026,808, cooling water flows along linear channels formed in the superposed punched plates between the linear portions that are adjacent in the direction crossing the first direction. In these channels, the linking portions formed at the punched plates are disposed at the same positions at alternate punched plates in the direction of superposition, whereas the linking portions at adjacent punched plates are disposed spaced apart in the first direction. Therefore, flows of the cooling water are disrupted in the lamination direction of the punched plates, and a temperature distribution of the cooling water in the channels in the lamination direction of the punched plates (a case vertical direction) is more homogenous. However, there are commercial demands for further improvements in cooling performance.

In consideration of the circumstances described above, an object of the present disclosure is to provide a cooling device that improves agitation performance of coolant flowing through a channel formed an interior of the device, and a method of manufacturing the cooling device.

Solution to Problem

A cooling device according to an aspect of the present disclosure includes: a case equipped with a supply port and a discharge port, the supply port supplying a coolant to an interior of the case, and the discharge port discharging the coolant from the interior of the case to an exterior of the case; and a stacked core disposed in the case, the stacked core comprising a plurality of punched plates, each with the same shape, and each punched plate including: a plurality of linear portions that extend in waveform shapes in a flow direction of the coolant and that are spaced apart in an amplitude direction of the waveforms, and linking portions that are spaced apart in an extension direction of the linear portions and that link the linear portions to one another in the amplitude direction, the punched plates being alternately disposed front-to-back and the linear portions being superposed over one another, and the linking portions of the superposed punched plates being disposed spaced apart in the extension direction.

Advantageous Effects of Invention

As described above, according to the present disclosure, a cooling device that improves agitation performance of coolant flowing through a channel formed an interior of the device, and a method of manufacturing the cooling device, may be provided.

BRIEF DESCRIPTION OF DRAWINGS

FIG. 11 is a perspective view of the cooling device according to the alternative exemplary embodiment.

DETAILED DESCRIPTION

Figure 1:
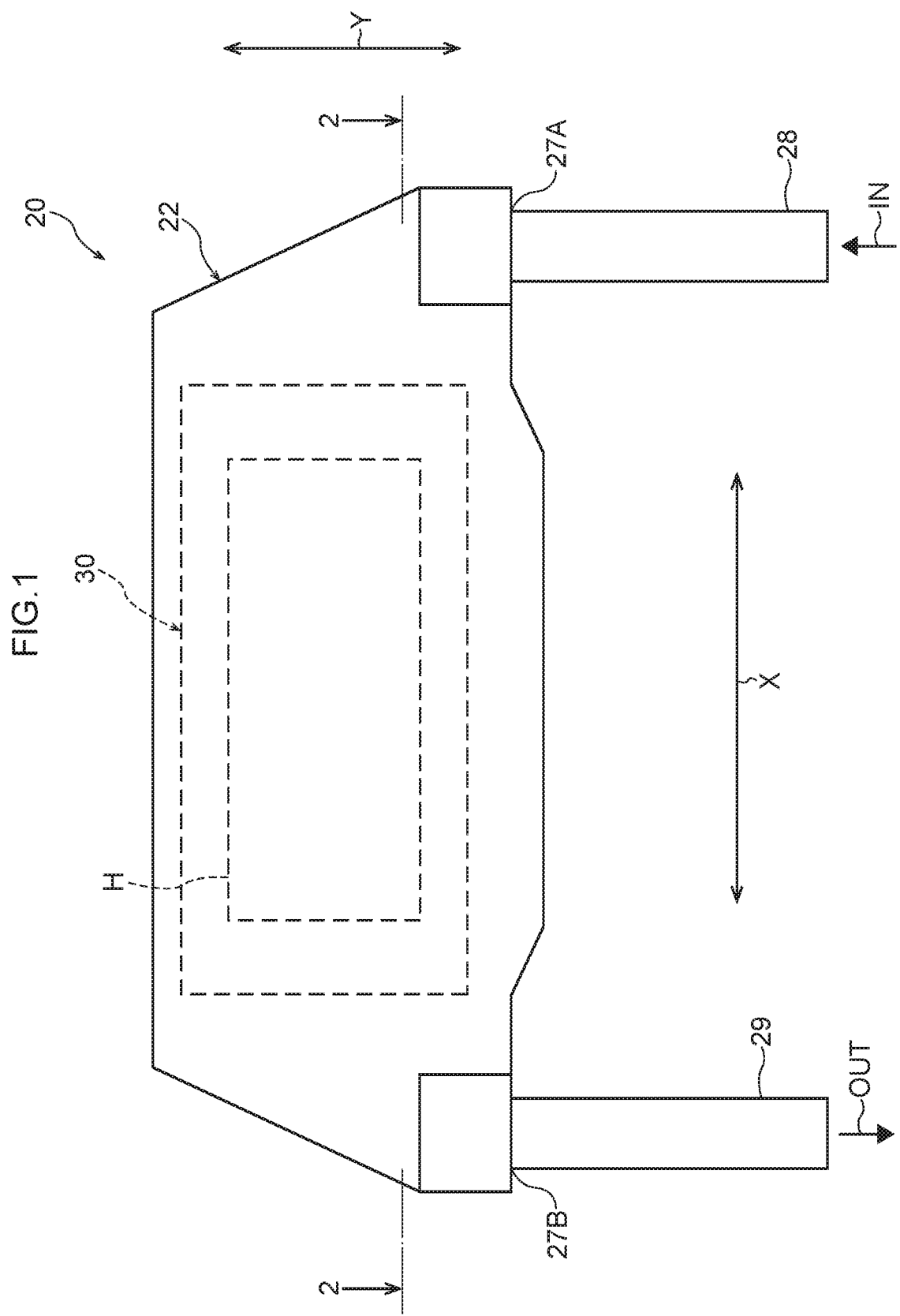
FIG. 1 is a plan view of a cooling device according to an exemplary embodiment of the present disclosure.

Below, a cooling device and a method of manufacturing the cooling device according to an exemplary embodiment relating to the present disclosure are described with reference to the drawings. The arrow X, arrow Y and arrow Z that are shown where appropriate in the drawings represent, respectively, a device width direction of the cooling device, a device depth direction and a device thickness direction. In the present exemplary embodiment, the arrow Z direction is also referred to as a device vertical direction.

FIG. 1 depicts a cooling device 20 according to the present exemplary embodiment. The cooling device 20 is used for cooling a heat-generating body (object of cooling) H such as, for example, a CPU, a power semiconductor device or the like. To be specific, the heat-generating body H is cooled by being put into contact with the cooling device 20 and heat from the heat-generating body H being conducted to coolant flowing an interior of the cooling device 20.

Figure 2:
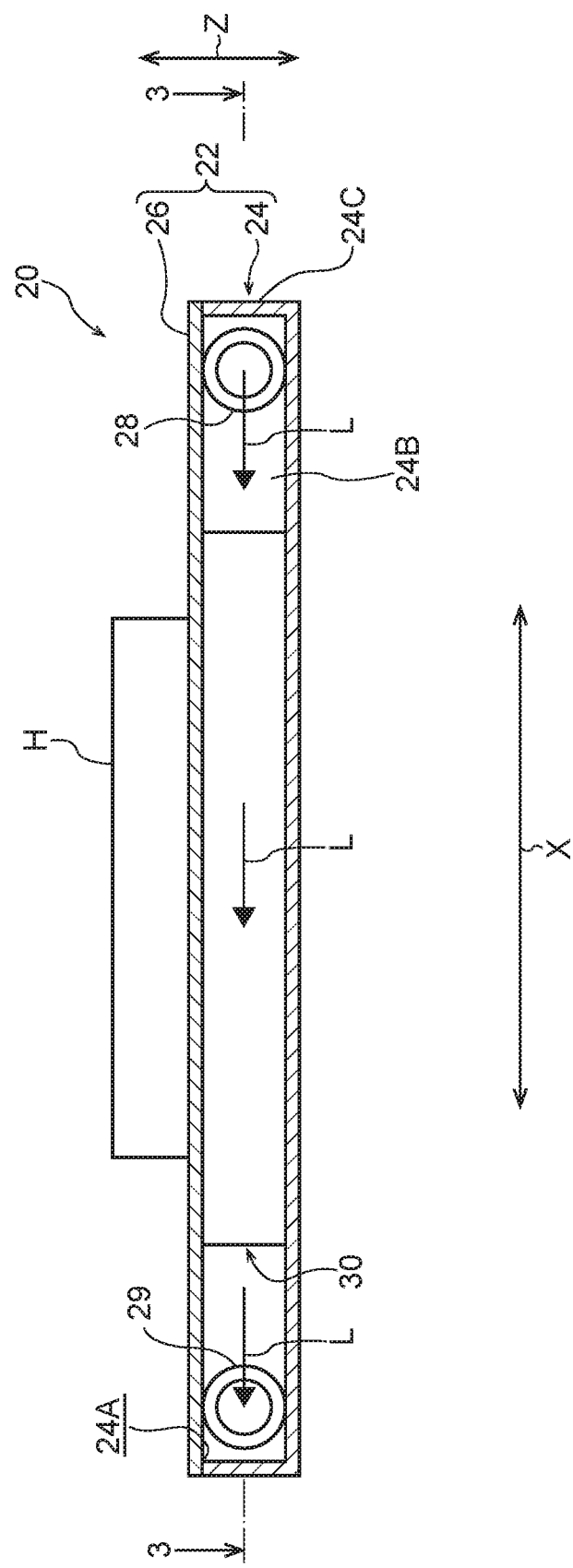
FIG. 2 is a sectional diagram cut along line 2-2 in FIG. 1.

As shown in FIG. 1 and FIG. 2, the cooling device 20 according to the present exemplary embodiment includes a case 22 and a stacked core 30 that is disposed an interior of the case 22.

—The Case 22—

As shown in FIG. 2, the case 22 includes a case main body 24 and a lid body 26. The lid body 26 closes off an aperture 24A in the device thickness direction in the case main body 24.

The case main body 24 is structured by a plate-shaped floor portion 24B and a side wall portion 24C that stands from outer periphery edge portions of the floor portion 24B. The case main body 24 is formed using metal members (for example, of aluminium or copper).

As shown in FIG. 1 and FIG. 2, the lid body 26 is formed in a plate shape and is joined to end faces of the side wall portion 24C of the case main body 24 at the opposite side of the side wall portion 24C from the side thereof at which the floor portion 24B is provided. In the present exemplary embodiment, the lid body 26 is joined by brazing to the end faces of the case main body 24. The lid body 26 is formed using a metal member (for example, of aluminium or copper).

A supply port 27A is formed in the side wall portion 24C of the case main body 24 at one end side in the device width direction. The supply port 27A is for supplying coolant (for example, cooling water or oil) to the interior of the case 22. A supply pipe 28 (see FIG. 1) is connected to the supply port 27A. The supply pipe 28 is connected to a coolant supply source.

A discharge port 27B is formed in the side wall portion 24C of the case main body 24 at the other end side in the device width direction. The discharge port 27B is for discharging coolant the interior of the case 22 to an exterior. A discharge pipe 29 (see FIG. 1) is connected to the discharge port 27B.

—The Stacked Core 30—

As shown in FIG. 3 to FIG. 6, the stacked core 30 is formed by alternately disposing front side against rear side and superposing a plural number of punched plates 32 having the same shape. To be specific, a rear face 32B (the face illustrated in FIG. 5) of another of the punched plates 32 is superposed on a front face 32A (the face illustrated in FIG. 4) of one of the punched plates 32. The stacked core 30 according to the present exemplary embodiment is formed by superposing six of the punched plates 32. In other words, the punched plates 32 in the stacked core 30 form a six-layer structure.

In each punched plate 32, a plural number of linear portions 34 and a plural number of linking portions 36 are formed by punching of a plate fabricated of metal. Using, for example, aluminium or copper as the material of the plate constituting the punched plate 32 is preferable. In the present exemplary embodiment, with a view to brazing, a clad steel plate at both faces of which a brazing layer (fabricated of aluminium) is formed is employed.

Each linear portion 34 extends in a waveform shape in a flow direction of a coolant L (in the present exemplary embodiment, the same direction as the device width direction). The linear portions 34 are plurally provided spaced apart in the amplitude direction of the waveforms (in the present exemplary embodiment, a direction the same as the device depth direction). Each linear portion 34 according to the present exemplary embodiment extends in the flow direction of the coolant L in triangle waveforms (in other words, a zigzag shape). The linear portions 34 that are adjacent in the amplitude direction are arranged to be parallel with one another.

The linking portions 36 are provided spaced apart in an extension direction of the linear portions 34. The linking portions 36 link the linear portions 34 that are adjacent in the amplitude direction to one another. The meaning of the term "extension direction of the linear portions 34" as used herein is intended to include a direction along center lines tracing amplitude centers of the linear portions 34.

Of two linear portions 34 that are adjacent in the amplitude direction, each of the linking portions 36 links an amplitude peak portion 34A of one of the two linear portions 34 with a general portion 34B of the other of the two linear portions 34. The meaning of the term "general portion 34B" as used herein is intended to include a region of the linear portion 34 other than the peak portions 34A. In the present exemplary embodiment, because each linear portion 34 is formed in triangle waveforms, the peak portions 34A are vertex portions of the triangle waves, and the general portions 34B are linear portions joining the peak portions 34A. Each of the linking portions 36 extends from the amplitude peak portion 34A of the one linear portion 34 (the opposite side of the waveform from a valley portion) along a line extending from the general portion 34B of the one linear portion 34 to the general portion 34B of the other linear portion 34.

The stacked core 30 mentioned above is formed by alternately disposing front side against rear side and laminating a plural number (six in the present exemplary embodiment) of the punched plates 32, such that the linear portions 34 are superposed over one another but the linking portions 36 are disposed apart from one another in the extension direction of the linear portions 34. The superposed punched plates 32 are joined to one another by brazing.

An upper face of the stacked core 30 (a face of the punched plate 32 that is disposed at the lamination upper side) is brazed to a lower face of the lid body 26. Meanwhile, a lower face of the stacked core 30 (a face of the punched plate 32 that is disposed at the lamination lower side) is brazed to a floor face of the case main body 24.

Channels 38 are formed in the stacked core 30 between the linear portions 34 of the superposed punched plates 32 that are adjacent in the amplitude direction. Seen in the lamination direction of the punched plates 32 (a direction the same as the device vertical direction), each channel 38 is formed in triangle waveforms similarly to the linear portions 34.

Figure 3:
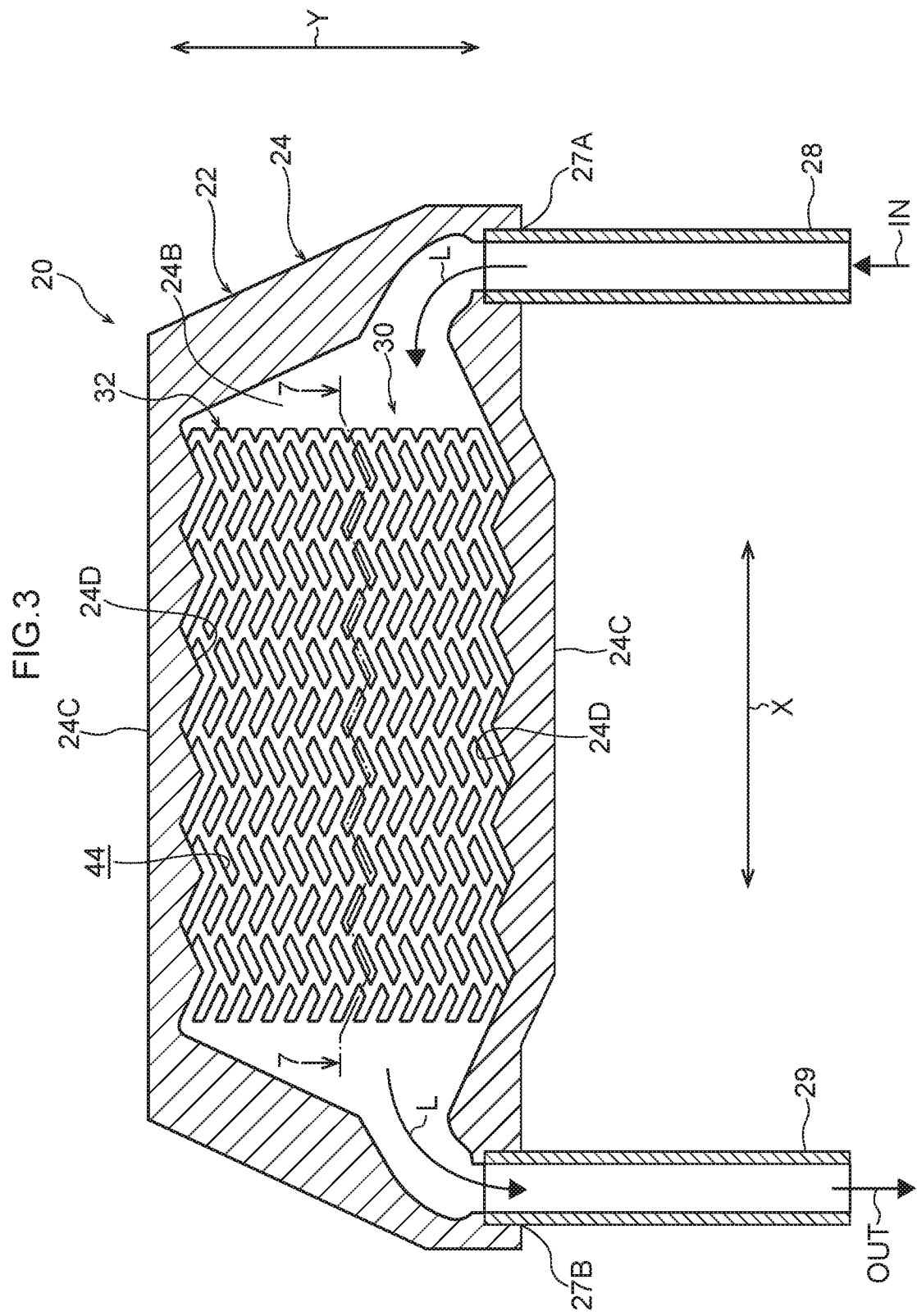
FIG. 3 is a sectional diagram cut along line 3-3 in FIG. 2.
Figure 4:
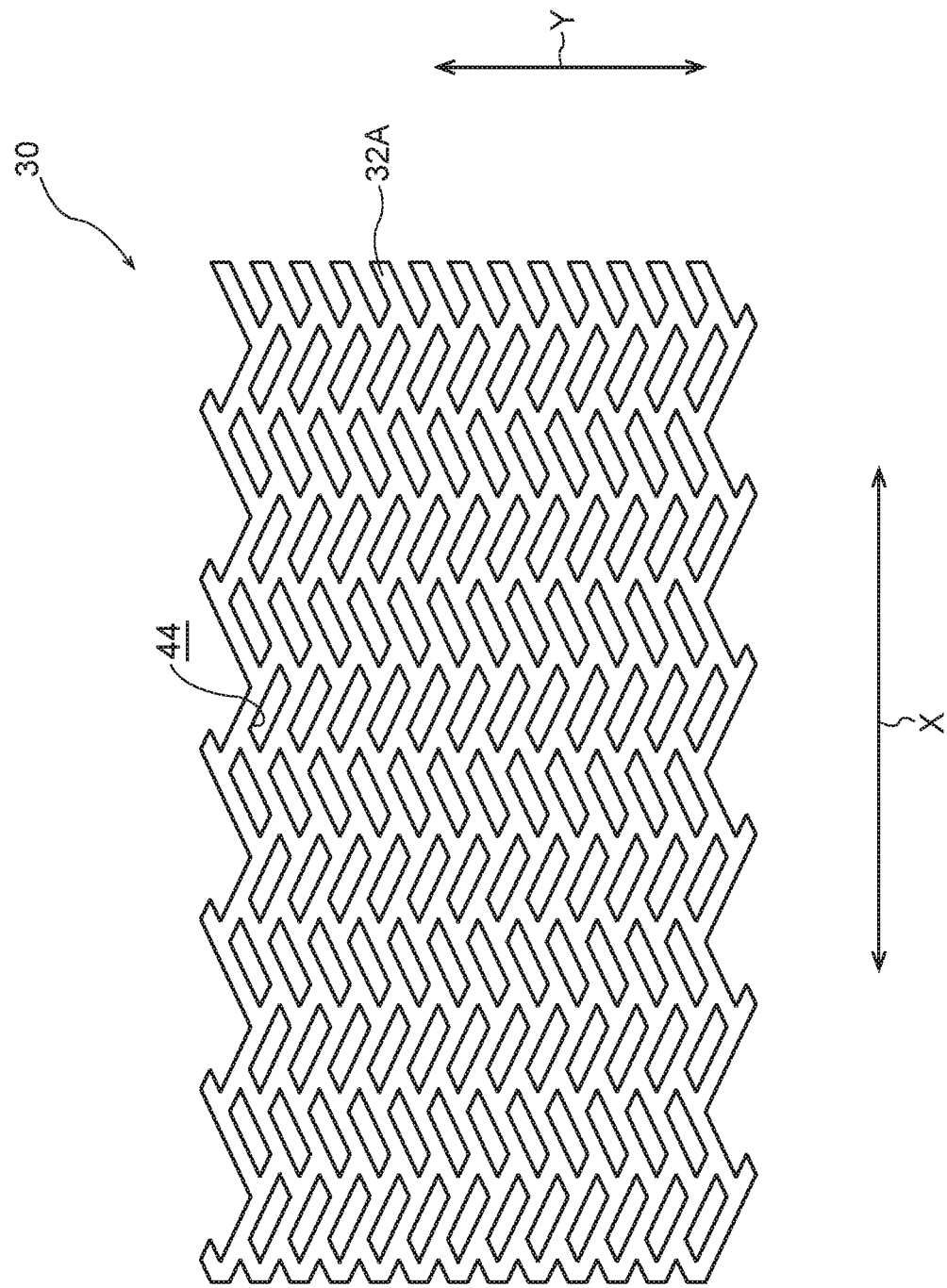
FIG. 4 is a plan view showing a front face of a punched plate that forms a stacked core in FIG. 2.
Figure 5:
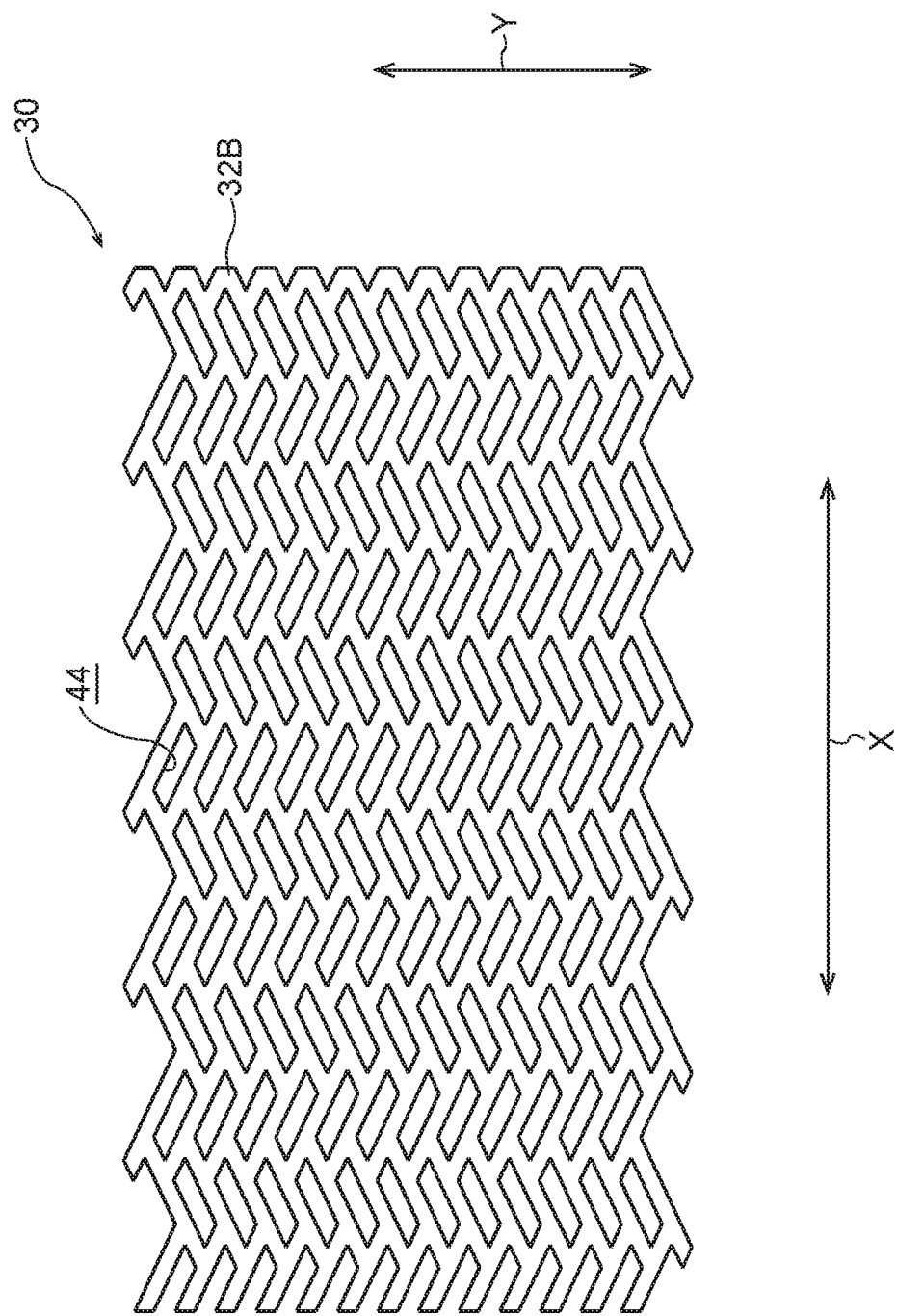
FIG. 5 is a plan view showing a rear face of the punched plate in FIG. 4.
Figure 6:
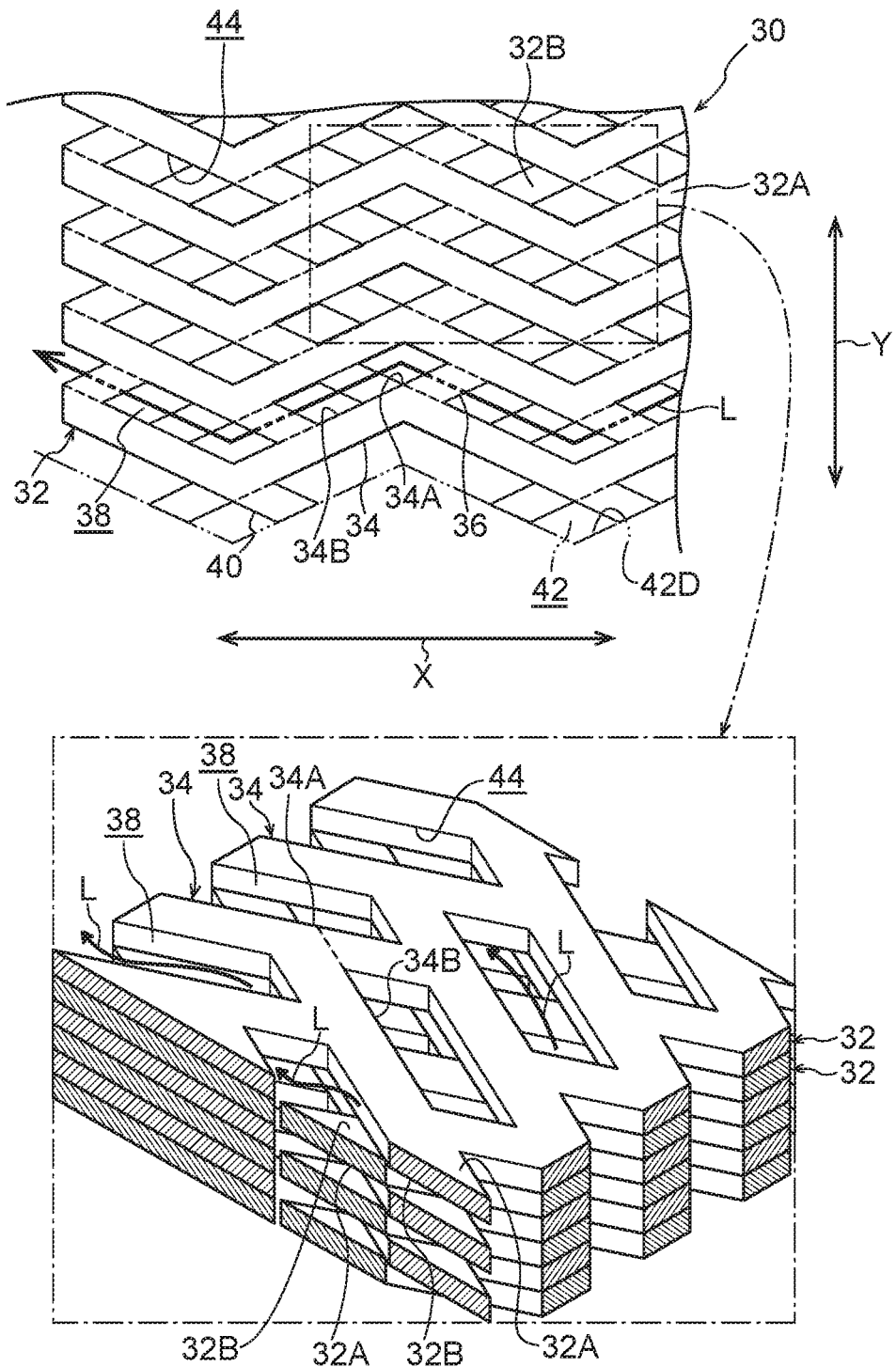
FIG. 6 is a magnified plan view in which a portion of the stacked core in FIG. 2 is magnified, and a perspective view of a portion of the magnified plan view.

As shown in FIG. 3, waveform portions 24D with the same shape as the linear portions 34 are formed at an inner wall face of the case main body 24 (an inner wall face of the side wall portion 24C). Outer side linking portions 40 are provided at the above-described punched plates 32, spaced apart in the extension direction of the linear portions 34. The outer side linking portions 40 are for linking the linear portions 34 with the waveform portions 24D. Channels 42 are formed between the waveform portions 24D and the stacked core 30. Seen in the lamination direction of the punched plates 32, the channels 42 are formed in triangle waveforms similarly to the linear portions 34.

Now, a method of manufacturing the cooling device 20 according to the present exemplary embodiment is described.

—First Step—

First, plural long holes 44 are formed by punching of each of plates that are to be the punched plates 32. Thus, the linear portions 34 and the linking portions 36 are formed. The linear portions 34 extend in the waveform shapes in a first direction and are provided spaced apart in the amplitude direction of the waves. The linking portions 36 are provided spaced apart in the extension direction of the linear portions 34 and link the adjacent linear portions 34 with one another in the amplitude direction.

—Second Step—

Then, the plural number (six in the present exemplary embodiment) of the punched plates 32 having the same shape are alternately disposed front side against rear side and superposed such that the linear portions 34 are superposed over one another but the linking portions 36 are disposed apart from one another in the first direction, forming the stacked core 30. Subsequently, the stacked core 30 is heated and the superposed punched plates 32 are joined to one another by brazing.

—Third Step—

Then, the stacked core 30 is placed on the floor portion 24B of the case main body 24 (the state shown in FIG. 2). Thereafter, the aperture 24A of the case main body 24 is closed off with the lid body 26. Hence, the lower face of the stacked core 30 is in contact with the floor face of the case 22 and the upper face of the stacked core 30 is in contact with the lower face of the lid body 26.

The case 22 is heated, and the case 22 and stacked core 30 are joined by brazing. Thus, the method of manufacturing the cooling device 20 is completed.

Now, operational effects of the cooling device 20 according to the present exemplary embodiment are described.

A heat-generating body H is disposed at the cooling device 20 so as to be in contact with the case 22, as shown in FIG. 1 and FIG. 2. Hence, heat from the heat-generating body H is conducted to the case 22, and through the case 22 to the stacked core 30. The case 22 and the stacked core 30 are cooled by heat exchange with the coolant L supplied into the case 22. Thus, the heat of the heat-generating body H is taken up by (conducted to) the coolant, and the heat-generating body H is cooled.

In the cooling device 20, the channels 38 are formed in the superposed punched plates 32 between the linear portions 34 that are adjacent in the waveform amplitude direction. Because the channels 38 are formed in similar waveform shapes to the linear portions 34, flows of the coolant L flowing an interior of the channels 38 may be disrupted (see FIG. 6) in the waveform amplitude direction (the device depth direction) more than in, for example, a structure in which the channels are formed in linear shapes. In other words, the coolant L flowing through the channels 38 may be agitated in the waveform amplitude direction.

Figure 7:
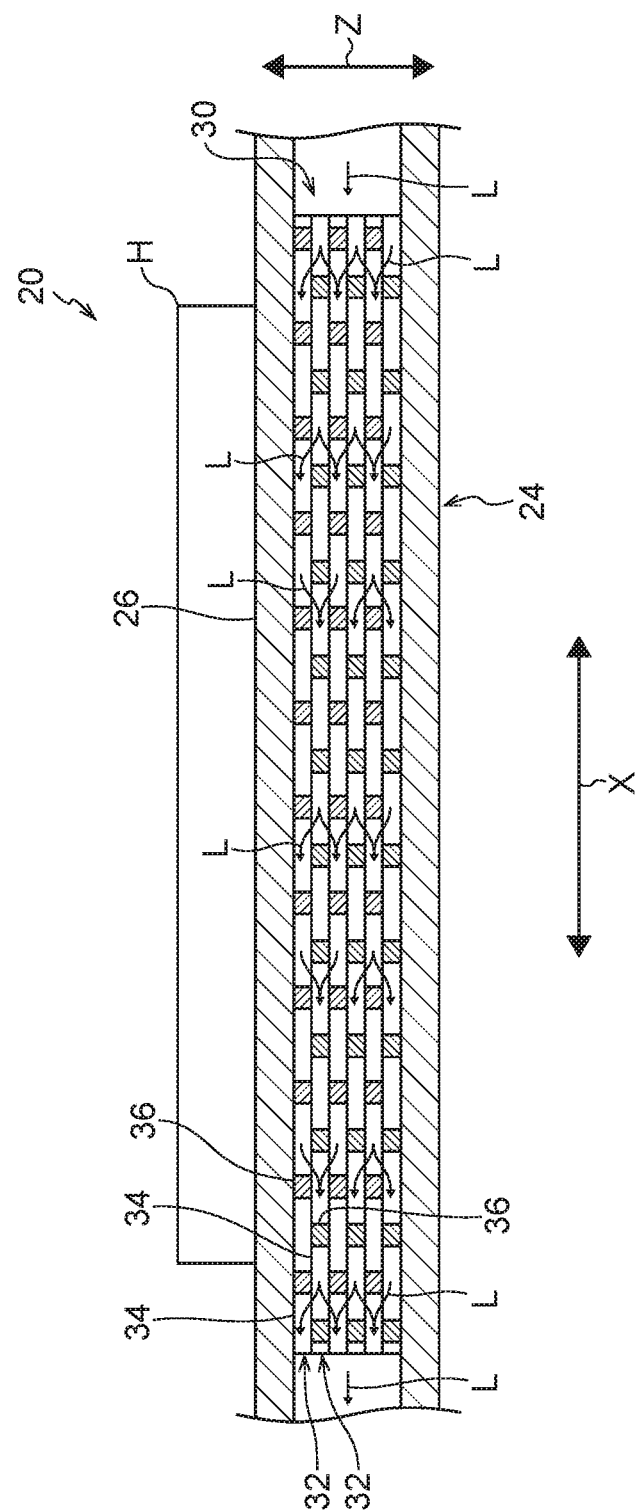
FIG. 7 is a sectional diagram cut along line 7-7 in FIG. 3.
Figure 8:
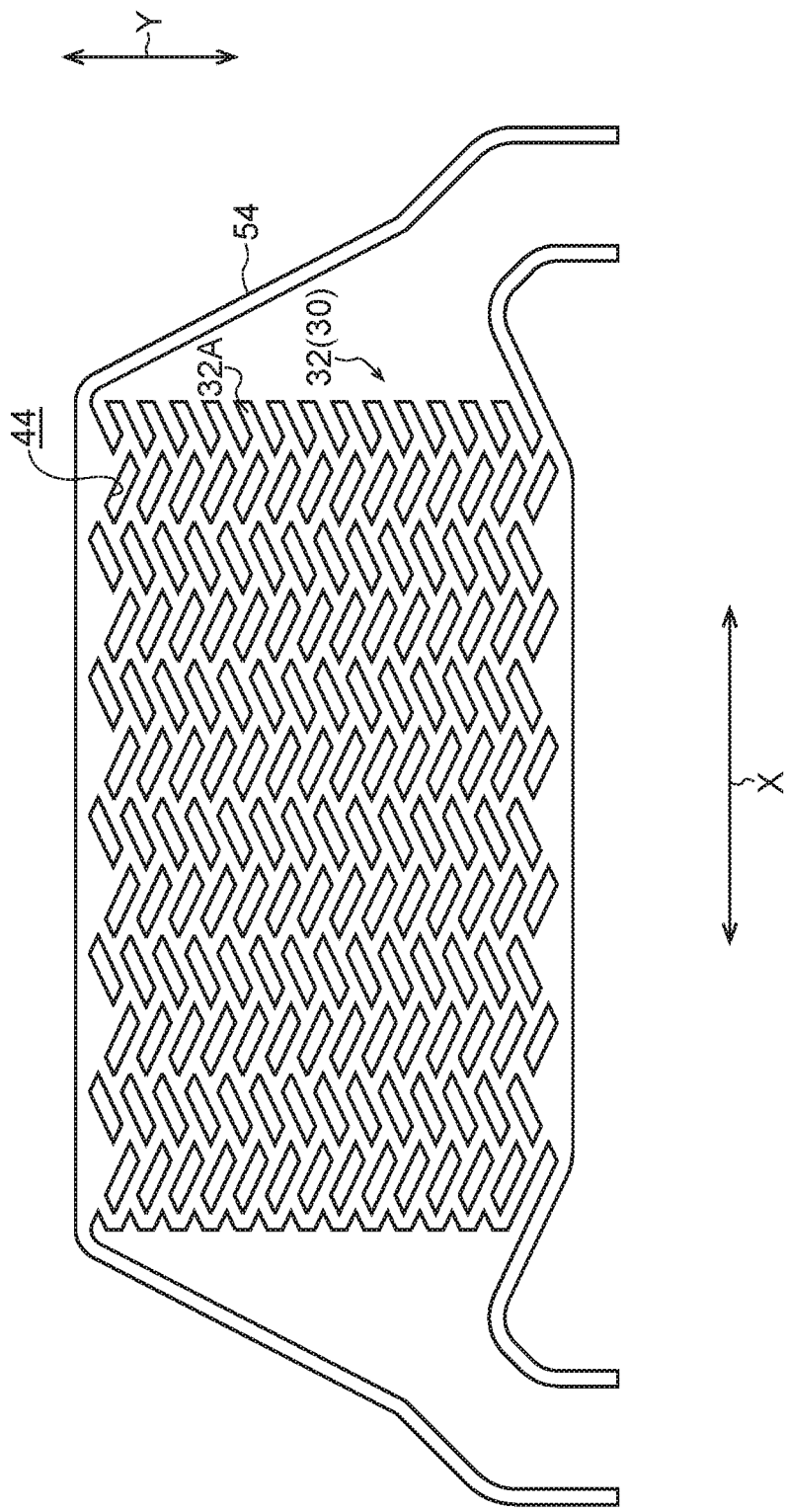
FIG. 8 is a plan view showing a front face of a punched plate that forms a stacked core of a cooling device according to an alternative exemplary embodiment of the present disclosure.
Figure 9:
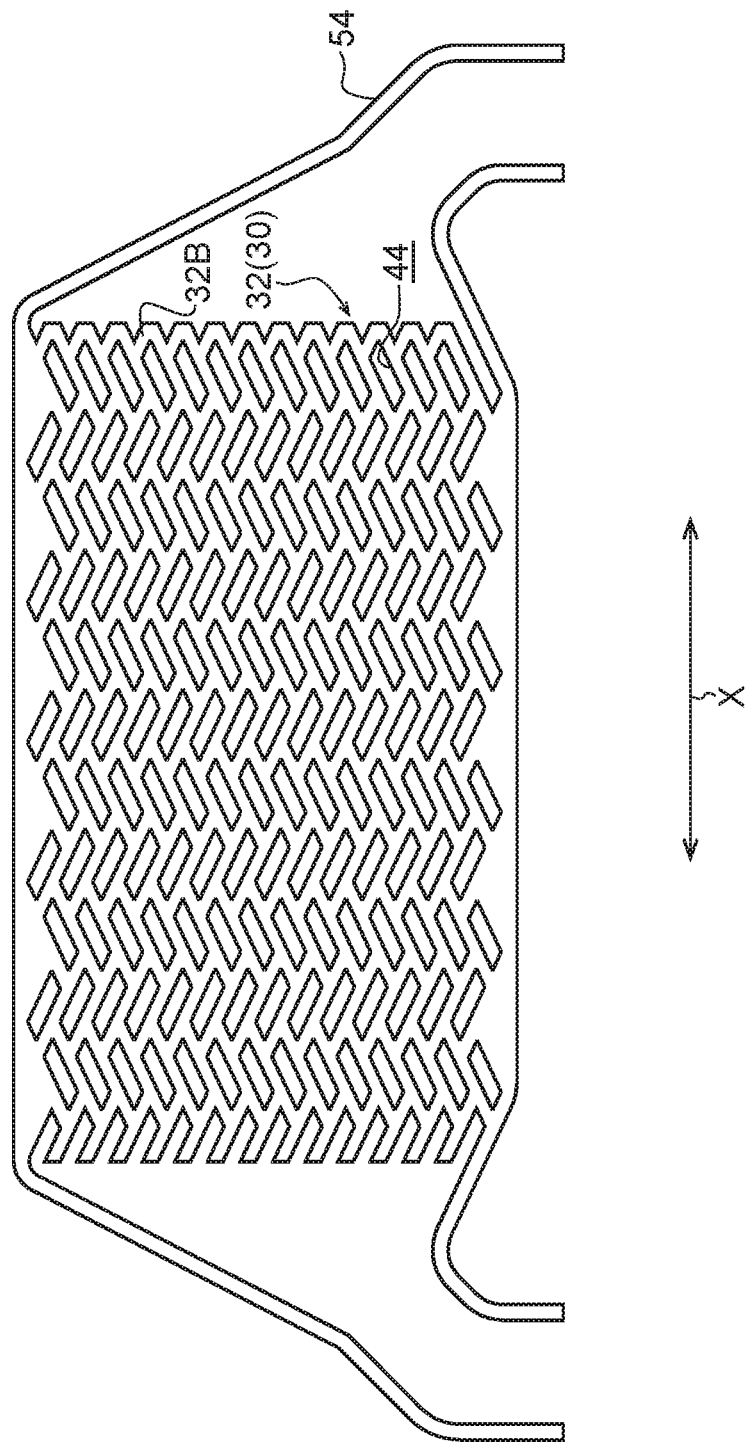
FIG. 9 is a plan view showing a rear face of the punched plate in FIG. 8.
Figure 10:
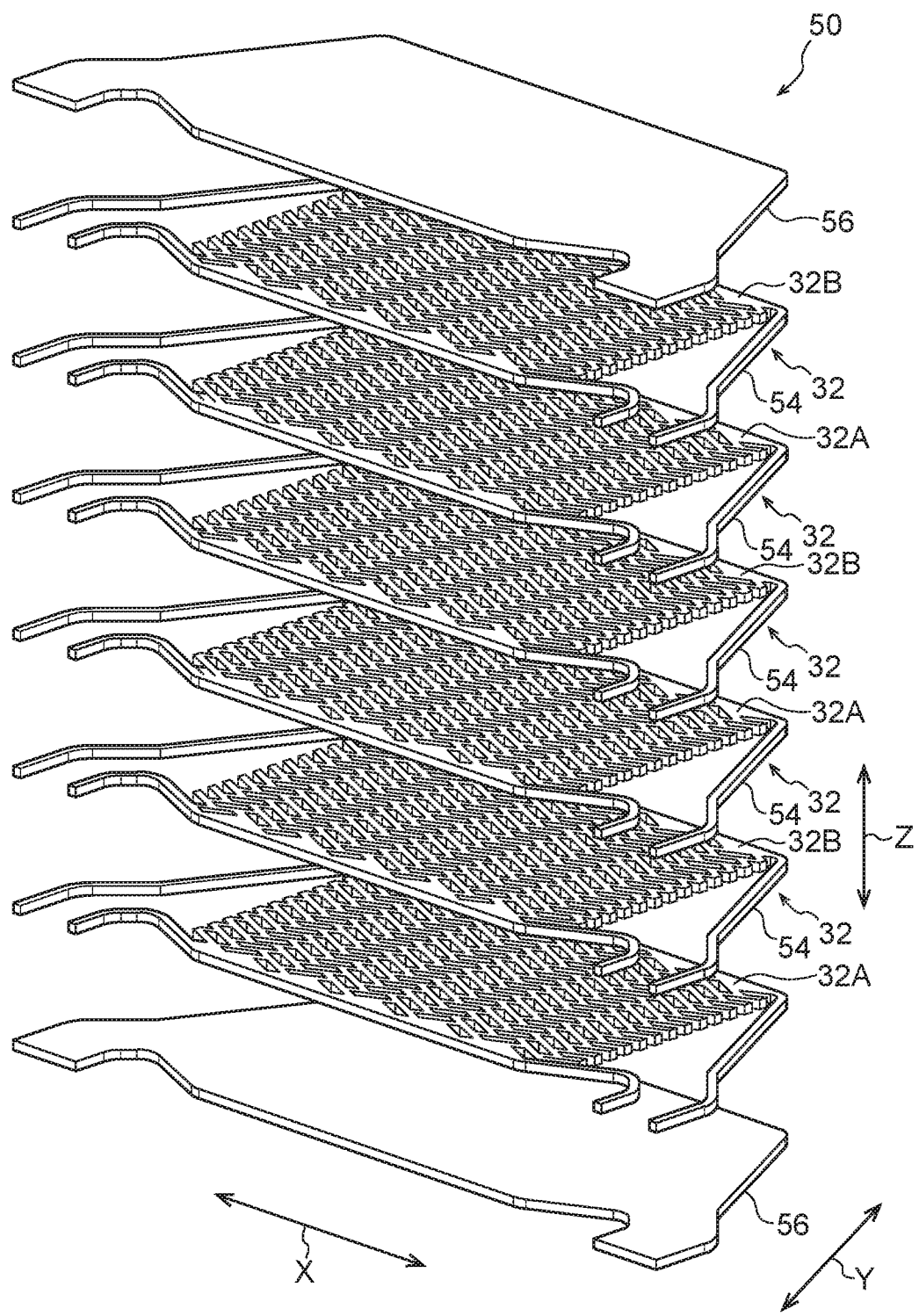
FIG. 10 is an exploded perspective view of the cooling device of FIG. 8.

The linking portions 36 formed in the punched plates 32 are disposed spaced apart from one another in the extension direction of the linear portions 34 in adjacent punched plates 32. To be specific, the linking portions 36 are disposed at matching positions in the lamination direction in alternate layers of the punched plates 32, and the linking portions 36 are disposed apart from one another in the extension direction of the linear portions 34 in adjacent layers of the punched plates 32. Consequently, the flows of the coolant flowing through the channels 38 may be disrupted in the lamination direction of the punched plates 32 by the linking portions 36 (see FIG. 7). In other words, the coolant flowing through the channels 38 may be agitated in the lamination direction of the punched plates 32.

Thus, in the cooling device 20, the coolant flowing through the channels 38 may be both agitated in the amplitude direction of the channels 38 (the device depth direction) and agitated in the lamination direction of the punched plates 32 (the device vertical direction).

Due thereto, according to the cooling device 20, agitation performance of the coolant flowing through the channels 38 may be improved. As a result, a temperature distribution in the channels 38 may be made more homogenous in the device vertical direction and the device depth direction, and cooling performance of the cooling device is improved.

In the cooling device 20, each of the linking portions 36 links the amplitude peak portion 34A of the one linear portion 34 with the general portion 34B of the other linear portion 34 that is adjacent in the amplitude direction. Therefore, in the cooling device 20, momentum of the coolant flowing through the channels 38 is less likely to be lowered than in, for example, a structure in which each of the linking portions 36 links the amplitude peak portion 34A of the one linear portion 34 with an amplitude bottom portion of the other linear portion 34 (the opposite side of that waveform from the peak portion 34A thereof, which is to say, a valley portion). Furthermore, in the cooling device 20, warping of each plate after punching (the punched plates 32) is less likely to occur than in a structure in which, for example, the linking portions 36 link the general portions 34B of the one linear portion 34 with the general portions 34B of the other linear portion 34.

In the cooling device 20, the channels 42 formed between the stacked core 30 and the waveform portions 24D of the case 22 provide the same effects as the channels 38. Therefore, cooling performance of the cooling device 20 is further improved.

In the cooling device 20, because the stacked core 30 is formed by the plural punched plates 32 having the same shape being alternately disposed front side against rear side and stacked, a component count may be reduced compared to, for example, a structure in which a stacked core is formed by laminating plural punched plates with different shapes. Furthermore, because the stacked core 30 is formed of the plural punched plates 32 having the same shape, component management costs and tooling costs for the manufacturing steps may be reduced.

In the exemplary embodiment described above, the stacked core 30 is formed by laminating six of the punched plates 32 having the same shape, but the present disclosure is not limited by this structure. The same operational effects as in the exemplary embodiment described above may be obtained as long as the stacked core is formed by laminating at least two of the punched plates 32 having the same shape.

In the exemplary embodiment described above, the linear portions 34 are formed in triangle waveforms, but the present disclosure is not limited by this structure. For example, the linear portions 34 may be formed in sinusoidal waveforms or trapezoid waveforms.

In the exemplary embodiment described above, the case 22 and the stacked core 30 are separate bodies, but the present disclosure is not limited by this structure. For example, as in a cooling device 50 illustrated in FIG. 8 to FIG. 11, a structure is possible in which linear portions 54 are formed at the punched plates 32 forming the stacked core 30. The linear portions 54 serve as outer periphery portions (side wall portions) 52A of a case 52. According to this structure, the outer periphery portions 52A are formed by the linear portions 54 that are superposed when the punched plates 32 having the same shape are alternately disposed front side against rear side and stacked. An upper face 52B (one heat-conducting surface) and a lower face 52C (another heat-conducting surface) of the case 52 are formed by plates 56 that have the same shape. Therefore, a component count of the cooling device 50 may be further reduced compared to the exemplary embodiment described above.

In the foregoing, an exemplary embodiment of the present disclosure has been illustrated and the exemplary embodiment has been described. However, this exemplary embodiment is an example; numerous modifications may be embodied within a scope not departing from the gist of the disclosure. It will be clear that the technical scope of the present disclosure is not to be limited by the exemplary embodiment.

The following notes are disclosed in relation to the exemplary embodiment described above.

—Note 1—

A cooling device includes:

a case equipped with a supply port and a discharge port, the supply port supplying a coolant to an interior of the case, and the discharge port discharging the coolant from the interior of the case to an exterior of the case; and a stacked core disposed in the case, the stacked core comprising a plurality of punched plates, each with the same shape, and each punched plate including:

a plurality of linear portions that extend in waveform shapes in a flow direction of the coolant and that are spaced apart in an amplitude direction of the waveforms, and linking portions that are spaced apart in an extension direction of the linear portions and that link the linear portions to one another in the amplitude direction, the punched plates being alternately disposed front-to-back and the linear portions being superposed over one another, and the linking portions of the superposed punched plates being disposed spaced apart in the extension direction.

In the cooling device according to note 1, an object of cooling is disposed so as to be in contact with the case. Hence, heat from the object of cooling is conducted to the case and the stacked core. The case and the stacked core are cooled by the coolant supplied into the case. Thus, heat from the object of cooling is taken up by (conducted to) the coolant, and the object of cooling is cooled.

In the superposed punched plates of the cooling device described above, a channel is formed between linear portions that are adjacent in the waveform amplitude direction. This channel is formed in a similar waveform shape to the linear portions. Consequently, a flow of coolant flowing an interior of the channel may be disrupted in the waveform amplitude direction more than in a structure in which, for example, the channel is formed in a linear shape. In other words, the coolant flowing through the channel may be agitated in the waveform amplitude direction.

Of the linking portions formed in the punched plates, the linking portions in adjacent punched plates are disposed to be spaced apart in the extension direction of the linear portions. Consequently, the flow of coolant flowing through the channel may be disrupted in the lamination direction of the punched plates by the linking portions. In other words, the coolant flowing through the channel may be agitated in the lamination direction of the punched plates.

Thus, in the cooling device described above, the coolant flowing through the channel may be both agitated in the waveform amplitude direction and agitated in the punched plate lamination direction.

Due thereto, according to the cooling device according to note 1, agitation performance of the coolant flowing through the channel may be improved. As a result, cooling performance of the cooling device is improved.

—Note 2—

In the cooling device recited in note 1, each of the linking portions links an amplitude peak portion of one of the linear portions with a general portion of another of the linear portions that is adjacent to the one of the linear portions in the amplitude direction.

In the cooling device according to note 2, the amplitude peak portion of the one linear portion is linked with the general portion of the another linear portion that is adjacent in the amplitude direction by the linking portion. Therefore, in this cooling device, momentum of the coolant flowing through the channel is less likely to be lowered than in, for example, a structure in which the linking portion links the amplitude peak portion of the one linear portion with an amplitude bottom portion of the another linear portion (the opposite side of the waveform from the peak portion thereof, which is to say a valley portion). Furthermore, in the cooling device, warping of each plate after punching (the punched plates) is less likely to occur than in a structure in which, for example, the linking portion links a general portion of the one linear portion with the general portion of the another linear portion.

—Note 3—

In the cooling device recited in note 1 or note 2, an inner wall face of the case includes a waveform portion with the same shape as the linear portions, and the punched plates include outer side linking portions that are spaced apart in the extension direction of the linear portions, the outer side linking portions linking the linear portions with the waveform portion.

In the cooling device according to note 3, a channel formed between the linear portions of the superposed punched plates and the waveform portion of the inner wall face of the case provides the same effects as the channel formed in the superposed punched plates between the linear portions that are adjacent in the waveform amplitude direction. Therefore, cooling performance of the cooling device is further improved.

—Note 4—

A method of manufacturing the cooling device according to any one of note 1 to note 3, the method including:

a first step of forming, by punch molding a plate material that configures the punched plates:

the plurality of linear portions that extend in waveform shapes in a first direction and that are spaced apart in the waveform amplitude direction, and the linking portions that are spaced apart in the extension direction of the linear portions and that link the linear portions that are adjacent in the amplitude direction to one another; and a second step of forming the stacked core, including alternately disposing front side against rear side, and laminating, the plurality of punched plates having the same shape, such that the linear portions are superposed over one another and the linking portions are disposed apart from one another in the extension direction.

With the method of manufacturing the cooling device according to note 4, the cooling device in any one of note 1 to note 3 may be fabricated through the first step and the second step.

The disclosures of Japanese Patent Application No. 2017-004412 filed Jan. 13, 2017 are incorporated into the present specification by reference in their entirety.

All references, patent applications and technical specifications cited in the present specification are incorporated by reference into the present specification to the same extent as if the individual references, patent applications and technical specifications were specifically and individually recited as being incorporated by reference.

The invention claimed is:

1. A cooling device, comprising:
   a case equipped with a supply port and a discharge port, the supply port supplying a coolant to an interior of the case, and the discharge port discharging the coolant from the interior of the case to an exterior of the case; and
   a stacked core disposed in the case, the stacked core comprising a plurality of punched plates, each with a same shape, and each punched plate including:

a plurality of linear portions that extend in triangle waveforms in a flow direction of the coolant and that are spaced apart in an amplitude direction of the waveforms, and linking portions that are spaced apart in an extension direction of the linear portions and that link the linear portions to one another in the amplitude direction, the punched plates being alternately disposed front-to-back and the linear portions being superposed over one another, and the linking portions of the superposed punched plates being disposed spaced apart in the extension direction, wherein the plurality of linear portions include amplitude peak portions alternately arranged with straight general portions that extend diagonally with respect to the amplitude direction, and wherein each of the linking portions links an amplitude peak portion of one of the linear portions with a respective straight general portion of another of the linear portions that is adjacent to the one of the linear portions in the amplitude direction.

2. The cooling device according to claim 1, wherein each of the linking portions extends from the amplitude peak portion of one of the linear portions along a line extending from the straight portions of the one of the linear portions to the straight portions of another of the linear portions that is adjacent to the one of the linear portions in the amplitude direction.

3. The cooling device according to claim 1, wherein:

an inner wall face of the case includes a waveform portion with a same shape as the linear portions, and the punched plates include outer side linking portions that are spaced apart in the extension direction of the linear portions, the outer side linking portions linking the linear portions with the waveform portion of the inner wall face.

4. A method of manufacturing the cooling device according to claim 1, the method including:

forming, by punch molding a plate material that configures the punched plates:

the plurality of linear portions that extend in triangle waveforms in a first direction and that are spaced apart in the waveform amplitude direction, and the linking portions that are spaced apart in the extension direction of the linear portions and that link the linear portions that are adjacent in the amplitude direction to one another; and forming the stacked core, including alternately disposing front side against rear side, and laminating, the plurality of punched plates having a same shape, such that the linear portions are superposed over one another and the linking portions are disposed apart from one another in the extension direction.

5. The cooling device according to claim 1, wherein:

each of the linking portions links an amplitude peak portion of one of the linear portions with a general portion of another of the linear portions that is adjacent to the one of the linear portions in the amplitude direction, an inner wall face of the case includes a waveform portion with a same shape as the linear portions, and the punched plates include outer side linking portions that are spaced apart in the extension direction of the linear portions, the outer side linking portions linking the linear portions with the waveform portion of the inner wall face.

6. A method of manufacturing the cooling device according to claim 1, the method including:

forming, by punch molding a plate material that configures the punched plates:

the plurality of linear portions that extend in triangle waveforms in a first direction and that are spaced apart in the waveform amplitude direction, and the linking portions that are spaced apart in the extension direction of the linear portions and that link the linear portions that are adjacent in the amplitude direction to one another; and forming the stacked core, including alternately disposing front side against rear side, and laminating, the plurality of punched plates having a same shape, such that the linear portions are superposed over one another and the linking portions are disposed apart from one another in the extension direction.

7. A method of manufacturing the cooling device according to claim 3, the method including:

forming, by punch molding a plate material that configures the punched plates:

the plurality of linear portions that extend in triangle waveforms in a first direction and that are spaced apart in the waveform amplitude direction, and the linking portions that are spaced apart in the extension direction of the linear portions and that link the linear portions that are adjacent in the amplitude direction to one another; and forming the stacked core, including alternately disposing front side against rear side, and laminating, the plurality of punched plates having a same shape, such that the linear portions are superposed over one another and the linking portions are disposed apart from one another in the extension direction.

8. A method of manufacturing the cooling device according to claim 5, the method including:

forming, by punch molding a plate material that configures the punched plates:

the plurality of linear portions that extend in triangle waveforms in a first direction and that are spaced apart in the waveform amplitude direction, and the linking portions that are spaced apart in the extension direction of the linear portions and that link the linear portions that are adjacent in the amplitude direction to one another; and forming the stacked core, including alternately disposing front side against rear side, and laminating, the plurality of punched plates having a same shape, such that the linear portions are superposed over one another and the linking portions are disposed apart from one another in the extension direction.

* * * * *